US011300879B2

(12) United States Patent
Saito et al.

(10) Patent No.: US 11,300,879 B2
(45) Date of Patent: Apr. 12, 2022

(54) RESIST UNDERLAYER FILM FORMING COMPOSITION CONTAINING TRIARYLDIAMINE-CONTAINING NOVOLAC RESIN

(71) Applicant: NISSAN CHEMICAL CORPORATION, Tokyo (JP)

(72) Inventors: Daigo Saito, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 19 days.

(21) Appl. No.: 16/330,062

(22) PCT Filed: Aug. 28, 2017

(86) PCT No.: PCT/JP2017/030758
§ 371 (c)(1),
(2) Date: Mar. 1, 2019

(87) PCT Pub. No.: WO2018/043410
PCT Pub. Date: Mar. 8, 2018

(65) Prior Publication Data
US 2019/0212649 A1 Jul. 11, 2019

(30) Foreign Application Priority Data
Sep. 1, 2016 (JP) .............................. JP2016-170915

(51) Int. Cl.
*G03F 7/11* (2006.01)
*C08G 12/08* (2006.01)
*G03F 7/09* (2006.01)
*C09D 161/22* (2006.01)
*G03F 7/20* (2006.01)
*H01L 21/027* (2006.01)
*H01L 21/311* (2006.01)
*G03F 7/16* (2006.01)
*G03F 7/32* (2006.01)

(52) U.S. Cl.
CPC ............... *G03F 7/11* (2013.01); *C08G 12/08* (2013.01); *C09D 161/22* (2013.01); *G03F 7/094* (2013.01); *G03F 7/16* (2013.01); *G03F 7/168* (2013.01); *G03F 7/2037* (2013.01); *G03F 7/32* (2013.01); *H01L 21/0274* (2013.01); *H01L 21/31138* (2013.01); *H01L 21/31144* (2013.01)

(58) Field of Classification Search
CPC ......... C08G 12/08; C09D 161/22; G03F 7/11; G03F 7/94; H01L 21/0274; H01L 21/31138; H01L 21/31144
See application file for complete search history.

(56) References Cited

U.S. PATENT DOCUMENTS

| 3,558,559 | A  | * | 1/1971 | Bane ........................ C08K 5/10 |
|           |    |   |        | 525/508 |
| 9,676,892 | B2 | * | 6/2017 | Kim ....................... C08G 65/38 |
| 2013/0087529 | A1 | * | 4/2013 | Hatakeyama ..... H01L 21/31144 |
|              |    |   |        | 216/47 |
| 2016/0139509 | A1 | * | 5/2016 | Hashimoto ....... H01L 21/31138 |
|              |    |   |        | 438/703 |
| 2016/0266494 | A1 | * | 9/2016 | Kim ......................... G03F 7/30 |
| 2016/0326396 | A1 | * | 11/2016 | Nishimaki ................ G03F 7/11 |
| 2017/0315445 | A1 | * | 11/2017 | Hashimoto ............ C08G 61/12 |
| 2018/0314154 | A1 | * | 11/2018 | Saito ..................... G03F 7/2037 |
| 2018/0356732 | A1 | * | 12/2018 | Tokunaga ................ G03F 7/11 |

FOREIGN PATENT DOCUMENTS

| JP | 2013-083833 A | 5/2013 |
| WO | 2013/047516 A1 | 4/2013 |
| WO | 2014/208542 A1 | 12/2014 |
| WO | 2015/098594 A1 | 7/2015 |
| WO | 2016/072316 A1 | 5/2016 |
| WO | 2017/069063 A1 | 4/2017 |
| WO | 2017/094780 A1 | 6/2017 |

OTHER PUBLICATIONS

Oct. 24, 2017 International Search Report issued in International Patent Application No. PCT/JP2017/030758.
Oct. 24, 2017 Written Opinion of the International Searching Authority issued in International Patent Application No. PCT/JP2017/030758.

* cited by examiner

Primary Examiner — Peter L Vajda
Assistant Examiner — Nicholas E Brown
(74) Attorney, Agent, or Firm — Oliff PLC

(57) ABSTRACT

A material to form a resist underlayer film having properties achieving heat resistance, flattening properties, and etching resistance through lithography. A resist underlayer film forming composition including a polymer having a unit structure of Formula (1):

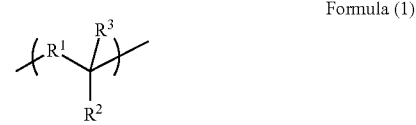

Formula (1)

(wherein $R^1$ is an organic group having at least two amines and at least three $C_{6-40}$ aromatic rings, $R^2$ and $R^3$ are each a hydrogen atom, a $C_{1-10}$ alkyl group, a $C_{6-40}$ aryl group, a heterocyclic group, or a combination thereof, and the alkyl group, the aryl group, and the heterocyclic group are optionally substituted with a halogen group, a nitro group, an amino group, a formyl group, an alkoxy group, or a hydroxy group, or $R^2$ and $R^3$ optionally form a ring together). The above mentioned composition t, wherein $R^1$ is a divalent organic group derived from N,N'-diphenyl-1,4-phenylenediamine.

12 Claims, No Drawings

RESIST UNDERLAYER FILM FORMING COMPOSITION CONTAINING TRIARYLDIAMINE-CONTAINING NOVOLAC RESIN

TECHNICAL FIELD

The present invention relates to a resist underlayer film forming composition for forming a flattened film on a stepped substrate, and a method for producing a laminated substrate that is flattened using a resist underlayer film formed from the composition.

BACKGROUND ART

In production of a semiconductor device, microprocessing has been conventionally carried out through lithography using a photoresist composition. The microprocessing is a processing method in which a thin film is formed from the photoresist composition on a substrate to be processed such as a silicon wafer, irradiated with active light such as ultraviolet light through a mask pattern including a pattern of the semiconductor device, and developed to obtain a photoresist pattern, and the substrate to be processed such as a silicon wafer is etched using the obtained photoresist pattern as a protective film. In recent years, an increase in degree of integration of semiconductor devices has advanced. As active light, an ArF excimer laser (193 nm) is used instead of a KrF excimer laser (248 nm), and thus, active light with shorter wavelength is more widely used. With the trend toward shorter wavelength, influences of diffuse reflection of active light from a substrate and standing wave have become a major issue. Therefore, an anti-reflective coating provided between a photoresist and a substrate to be processed has been widely used. For further microprocessing, a lithography technique using extreme ultraviolet light (EUV, 13.5 nm) or an electron beam (EB) as active light has also been developed. In EUV lithography and EB lithography, diffuse reflection from a substrate and standing wave do not generally occur, and thus a specific anti-reflective coating is not required. However, a resist underlayer film is widely beginning to be investigated as an auxiliary film for improving resolution and adhesion of a resist pattern.

With a shorter wavelength of exposure light, the depth of focus decreases. Accordingly, it is important that the flattening properties of a film to be formed on a substrate are improved to form a desired resist pattern with precision. For production of a semiconductor device with a fine design rule, a resist underlayer film that can be formed as a flat coating film having no steps on a substrate is required.

For example, a resist underlayer film forming composition containing a crosslinkable compound having a $C_{2-10}$ alkoxymethyl group or a $C_{1-10}$ alkyl group is disclosed (see Patent Document 1). Patent Document 1 describes that during applying the composition to a substrate having a hole pattern, the embeddability is good.

A phenylnaphthylamine novolac resin is used (see Patent Document 2).

PRIOR ART DOCUMENTS

Patent Documents

Patent Document 1: International publication WO 2014/208542

Patent Document 2: International publication WO 2013/047516

SUMMARY OF THE INVENTION

Problem to be Solved by the Invention

In order to prevent mixing of a resist underlayer film forming composition during laminating a photoresist composition or a resist underlayer film different from a resist underlayer film formed from the resist underlayer film forming composition, a self-crosslinkable moiety is introduced into a polymer resin that is a main component of the resist underlayer film forming composition, or a crosslinker, a crosslinking catalyst, or the like is appropriately added to the resist underlayer film forming composition, and the resist underlayer film forming composition is baked at high temperature to thermally cure a coating film. Thus, the photoresist composition and the different resist underlayer film can be laminated without mixing. Such a thermosetting resist underlayer film forming composition contains a polymer having a thermal crosslinking forming functional group such as a hydroxyl group, a crosslinker, and an acid catalyst (acid generator). Therefore, when a pattern (e.g., hole and trench structures) formed on a substrate is filled with the resist underlayer film forming composition, a crosslinking reaction is promoted due to baking, and thus the viscosity increases. Accordingly, the filling properties of the pattern are deteriorated, and thus the flattening properties after formation of a film tend to decrease.

An object of the present invention is to enhance the thermal reflow properties of a polymer and thus improve the filling properties of a pattern during baking. To enhance the thermal reflow properties of a polymer, a substituent capable of decreasing the glass transition temperature of the polymer, such as an alkyl group, is introduced into the polymer. Thus, the present invention provides a resist underlayer film forming composition that sufficiently expresses a decrease in viscosity before initiation of crosslinking reaction during baking, and forms a coating film having high flattening properties on a substrate.

Additionally, the present invention provides a resist underlayer film forming composition for forming a resist underlayer film further having heat resistance.

Means for Solving the Problems

A first aspect of the present invention is a resist underlayer film forming composition comprising a polymer having a unit structure of Formula (1):

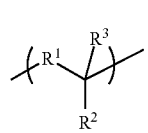

Formula (1)

(wherein $R^1$ is an organic group having at least two amines and at least three $C_{6-40}$ aromatic rings, $R^2$ and $R^3$ are each a hydrogen atom, a $C_{1-10}$ alkyl group, a $C_{6-40}$ aryl group, a heterocyclic group, or a combination thereof, and the alkyl group, the aryl group, and the heterocyclic group are optionally substituted with a halogen group, a nitro group, an amino group, a formyl group, an alkoxy group, or a hydroxy group, or $R^2$ and $R^3$ optionally form a ring together).

A second aspect of the present invention is the resist underlayer film forming composition according to the first aspect, wherein R' is a divalent organic group derived from a compound of Formula (2):

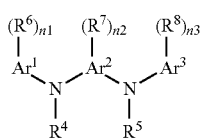

Formula (2)

(wherein $Ar^1$, $Ar^2$, and $Ar^3$ are each a benzene ring or a naphthalene ring, $R^6$, $R^7$, and $R^8$ are each a substituent, and are selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group optionally contain an ether bond, a ketone bond, or an ester bond, $R^4$ and $R^5$ are each selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group optionally contain an ether bond, a ketone bond, or an ester bond, and n1, n2, and n3 are each an integer of 0 to the maximum number of substitutions possible for each of substituents $R^6$, $R^7$, and $R^8$ on the rings of $Ar^1$, $Ar^2$, and $Ar^3$, respectively).

A third aspect of the present invention is the resist underlayer film forming composition according to the first aspect, wherein $R^1$ is a divalent organic group derived from N,N'-diphenyl-1,4-phenylenediamine.

A fourth aspect of the present invention is the resist underlayer film forming composition according to any one of the first to third aspects, wherein $R^3$ is a hydrogen atom, $R^2$ is an aryl group selected from the group consisting of a phenyl group, a naphthyl group, an anthryl group, and a pyrenyl group, and the aryl group is optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

A fifth aspect of the present invention is the resist underlayer film forming composition according to any one of the first to third aspects, wherein $R^3$ is a hydrogen atom, $R^2$ is a phenyl group, and the phenyl group is optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

A sixth aspect of the present invention is the resist underlayer film forming composition according to the first aspect, wherein the unit structure of Formula (1) is a unit structure of Formula (1-1):

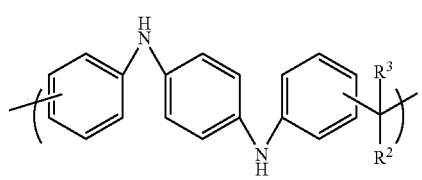

Formula (1-1)

(wherein $R^2$ and $R^3$ are each a hydrogen atom, a $C_{1-10}$ alkyl group, a $C_{6-40}$ aryl group, a heterocyclic group, or a combination thereof, and the alkyl group, the aryl group, and the heterocyclic group are optionally substituted with a halogen group, a nitro group, an amino group, a formyl group, an alkoxy group, or a hydroxy group, or $R^2$ and $R^3$ optionally form a ring together).

A seventh aspect of the present invention is the resist underlayer film forming composition according to any one of the first to sixth aspects, further comprising a crosslinker.

An eighth aspect of the present invention is the resist underlayer film forming composition according to any one of the first to seventh aspects, further comprising an acid and/or an acid generator.

A ninth aspect of the present invention is a resist underlayer film comprising a cured film of the resist underlayer film forming composition according to any one of the first to eighth aspects.

A tenth aspect is a method for producing a semiconductor device comprising steps of forming an underlayer film on a semiconductor substrate from the resist underlayer film forming composition according to any one of the first to eighth aspects, forming a resist film on the underlayer film, irradiating the resist film with light or an electron beam and developing the resist film to form a resist pattern, etching the underlayer film through the formed resist pattern, and processing the semiconductor substrate through the patterned underlayer film.

An eleventh aspect of the present invention is a method for producing a semiconductor device comprising steps of forming an underlayer film on a semiconductor substrate from the resist underlayer film forming composition according to any one of the first to eighth aspects, forming a hard mask on the underlayer forming a resist film on the hard mask, irradiating the resist film with light or an electron beam and developing the resist film to form a resist pattern, etching the hard mask through the formed resist pattern, etching the underlayer film through the patterned hard mask, and processing the semiconductor substrate through the patterned underlayer film.

Effects of the Invention

When the resist underlayer film forming composition of the present invention is applied to a substrate and baked, a pattern formed on the substrate is filled with the resist underlayer film forming composition by thermal reflow of a polymer. For example, when an alkyl group that generally decreases the glass transition temperature (Tg) of a polymer is added to a main resin skeleton in the resist underlayer film forming composition, the thermal reflow properties can be enhanced, and the filling properties of the pattern can be improved.

The inventors of the present invention have found that novolac resins obtained by a reaction of a compound having at least two amines and at least three $C_{6-40}$ aromatic rings with an aldehyde or a ketone has excellent properties of flattening a pattern. When the novolac resins include the alkyl group and another substituent in combination, a resist underlayer film having flattening properties and heat resistance can be obtained.

Therefore, from the resist underlayer film forming composition of the present invention, a flat film can be formed regardless of an open area (unpatterned area) or a pattern area of DENSE (dense) and ISO (coarse) patterns on the substrate. This satisfies both the filling properties of the pattern and the flattening properties after filling. The resist underlayer film forming composition allows an excellent flattened film to be formed.

A silicon hard mask layer may be formed as an upper layer of the resist underlayer film by a vapor deposition method, and thus the resist underlayer film is required to have heat resistance that is sufficiently resistant to heat during vapor deposition. Through a transferred pattern of the resist underlayer film, a substrate below the resist underlayer film is processed, and thus the resist underlayer film is required to have etching resistance.

The present invention can provide a material having properties achieving a good balance among heat resistance, flattening properties, and etching resistance of the resist underlayer film obtained from the resist underlayer film forming composition of the present invention.

MODES FOR CARRYING OUT THE INVENTION

The present invention is a resist underlayer film forming composition containing a polymer having a unit structure of Formula (1).

In the present invention, the resist underlayer film forming composition for lithography contains the aforementioned resin and a solvent. The resist underlayer film forming composition may contain a crosslinker and an acid, and if necessary, an acid generator, a surfactant, and the like. The solid content of the composition is 0.1 to 70% by mass, or 0.1 to 60% by mass. The solid content is the content ratio of all components of the resist underlayer film forming composition except for the solvent. The solid content may contain the aforementioned polymer in an amount of 1 to 100% by mass, 1 to 99.9% by mass, 50 to 99.9% by mass, 50 to 95% by mass, or 50 to 90% by mass.

The polymer used in the present invention has a weight average molecular weight of 600 to 1,000,000, or 600 to 200,000.

The polymer used in the present invention contains a repeating unit structure of Formula (1).

The polymer having the unit structure of Formula (1) is a novolac resin obtained by a reaction of an organic compound having at least two amines and at least three $C_{6-40}$ aromatic rings with an aldehyde or a ketone.

In Formula (1), $R^1$ is an organic group having at least two amines and at least three $C_{6-40}$ aromatic rings, $R^2$ and $R^3$ are each a hydrogen atom, a $C_{1-10}$ alkyl group, a $C_{6-40}$ aryl group, a heterocyclic group, or a combination thereof, and the alkyl group, the aryl group, and the heterocyclic group may be substituted with a halogen group, a nitro group, an amino group, a formyl group, an alkoxy group, or a hydroxy group, or $R^2$ and $R^3$ may form a ring together.

The amines include a primary amine structure, a secondary amine structure, and a tertiary amine structure. The aromatic rings include a benzene ring structure, a naphthalene ring structure, an anthracene ring structure, and a pyrene ring structure, and the like.

$R^1$ is an organic group having at least two amines and at least three $C_{6-40}$ aromatic rings. The organic group forms a main chain of the novolac resin, and may be used as a divalent organic group having the aforementioned amine structure and aromatic ring structure. In particular, $R^1$ is preferably a divalent organic group having two amines and three $C_{6-40}$ aromatic rings.

In Formula (1), $R^1$ may be a divalent organic group derived from a compound of Formula (2). An aromatic ring in Formula (2) forms a novolac resin with an aldehyde or a ketone. Formula (2) is a divalent organic group, and thus the aromatic ring in Formula (2) forms a bond for forming a novolac resin with an aldehyde or a ketone at any two positions of the aromatic ring in formula (2). For example, at $Ar^1$ and $Ar^3$, $Ar^1$ and $Ar^2$, $Ar^1$ and $Ar^1$, $Ar^2$ and $Ar^2$, at any two of $R^4$, $R^5$, $R^6$, $R^7$, or $R^8$ (here, each group is an aryl group), or at any one of $Ar^1$, $Ar^2$, or $Ar^3$ and any one of $R^4$, $R^5$, $R^6$, $R^7$, or $R^8$ (here, each group is an aryl group), an aryl group and the like can form a bond with an aldehyde or a ketone. When the substituent has an aromatic ring, the aromatic ring can form a bond with an aldehyde or a ketone.

In Formula (2), $Ar^1$, $Ar^2$, and $Ar^3$ are each a benzene ring or a naphthalene ring, $R^6$, $R^7$, and $R^8$ are each a substituent, and are selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group may contain an ether bond, a ketone bond, or an ester bond, $R^4$ and $R^5$ are each selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, or the aryl group may contain an ether bond, a ketone bond, or an ester bond, and n1, n2, and n3 are each an integer of 0 to the maximum number of substitutions possible for each of substituents $R^6$, $R^7$, and $R^8$ on the rings of $Ar^1$, $Ar^2$, and $Ar^a$, respectively. n1, n2, and n3 are each usually an integer of 0 or 1 to 4, 0 or 1 to 3, 0 or 1 to 2, or 0 or 1.

In Formula (1), $R^1$ may be a divalent organic group derived from N,N'-diphenyl-1,4-phenylenediamine. This compound has three benzene rings, and the substituent thereof may further have a benzene ring. Similarly, the benzene rings form a bond for forming a novolac resin with an aldehyde or a ketone at any two positions of the benzene rings.

The polymer having the unit structure of Formula (1) is preferably a polymer having a typical unit structure of Formula (1-1).

In Formula (1-1), $R^2$ and $R^3$ are each a hydrogen atom, a $C_{1-10}$ alkyl group, a $C_{6-40}$ aryl group, a heterocyclic group, or a combination thereof, and the alkyl group, the aryl group, and the heterocyclic group may be substituted with a halogen group, a nitro group, an amino group, a formyl group, an alkoxy group, or a hydroxy group, or $R^2$ and $R^3$ may form a ring together.

Examples of the halogen group include a fluorine atom, a chlorine atom, a bromine atom, and an iodine atom. Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethylcyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{1-10}$ alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenyl group, m-biphenyl group, p-biphenyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

The heterocyclic group is preferably an organic group including a 5- or 6-membered heterocycle containing nitrogen, sulfur, or oxygen. Examples thereof include pyrrole group, furan group, thiophene group, imidazole group, oxazole group, thiazole group, pyrazole group, isoxazole group, isothiazole group, and pyridine group.

A heterocyclic group containing sulfur is particularly preferable in use for a high refractive index material.

In Formula (1), $R^3$ is a hydrogen atom, $R^2$ is an aryl group selected from the group consisting of a phenyl group, a naphthyl group, an anthryl group, and a pyrenyl group, and the aryl group may be substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

$R^3$ is a hydrogen atom, $R^2$ is a phenyl group, and the phenyl group may be substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

Examples of an aldehyde used in production of the polymer of the present invention include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanealdehyde, 7-methoxy-3,7-dimethyloctylaldehyde, cyclohexanealdehyde, 3-methyl-2-butyraldehyde, glyoxal, malonaldehyde, succinaldehyde, glutaraldehyde, glutaraldehyde, and adipaldehyde; unsaturated aliphatic aldehydes such as acrolein and methacrolein; heterocyclic aldehydes such as furfural, pyridinealdehyde, and thiophenealdehyde; and aromatic aldehydes such as benzaldehyde, naphthaldehyde, anthracenecarboxyaldehyde, phenylbenzaldehyde, anisaldehyde, ethoxybenzaldehyde, n-pentyloxybenzaldehyde, n-octyloxybenzaldehyde, trimethoxybenzaldehyde, ethylbenzaldehyde, n-butylbenzaldehyde, t-butylbenzaldehyde, isopropylbenzaldehyde, isobutylbenzaldehyde, terephthalaldehyde, pyrenecarboxaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. In particular, an aromatic aldehyde may be preferably used.

Examples of a ketone used in production of the polymer of the present invention include diaryl ketones such as diphenyl ketone, phenyl naphthyl ketone, dinaphtyl ketone, phenyl tolyl ketone, ditolyl ketone, and 9-fluorenone.

In a novolac resin-forming reaction of an organic compound having at least two amino groups and at least three $C_{6-40}$ aryl groups, and suitably an aromatic compound that is a compound of Formula (2), with an aldehyde or a ketone, it is preferable that the aromatic compound be reacted with an aldehyde or a ketone at a ratio by mole of the aromatic compound to the aldehyde or ketone of 1:0.1 to 10, 1:0.5 to 2.0, or 1:1.

As an acid catalyst used in the aforementioned condensation reaction, for example, a mineral acid such as sulfuric acid, phosphoric acid, or perchloric acid, an organic sulfonic acid such as p-toluenesulfonic acid, p-toluenesulfonic acid monohydrate, methanesulfonic acid, or trifluoromethanesulfonic acid, or a carboxylic acid such as formic acid or oxalic acid is used. The amount of the acid catalyst to be used is variously selected depending on the type of the acid used. The amount is usually 0.001 to 10,000 parts by mass, preferably 0.01 to 1,000 parts by mass, and more preferably 0.1 to 100 parts by mass, relative to 100 parts by mass of the aromatic compound.

While the aforementioned condensation reaction is carried out without a solvent, the condensation reaction is usually carried out using a solvent. Any solvent may be used as long as it does not inhibit the reaction. Examples thereof include ethers such as 1,2-dimethoxyethane, diethylene glycol dimethyl ether, propylene glycol monomethyl ether, propylene glycol monomethyl ether acetate, butyl cellosolve, tetrahydrofuran, and dioxane. When the used acid catalyst is, for example, a liquid like formic acid, it can also act as a solvent.

The reaction temperature in condensation is usually 40° C. to 200° C. The reaction time is variously selected depending on the reaction temperature, and is usually about 30 minutes to about 50 hours.

The weight average molecular weight Mw of the polymer obtained as described above is usually 500 to 1,000,000 or 600 to 200,000.

Examples of a novolac resin obtained by the reaction of the aromatic compound with an aldehyde or a ketone include novolac resins having the following unit structures.

Formula (2-1)

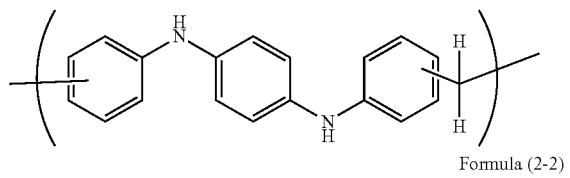

Formula (2-2)

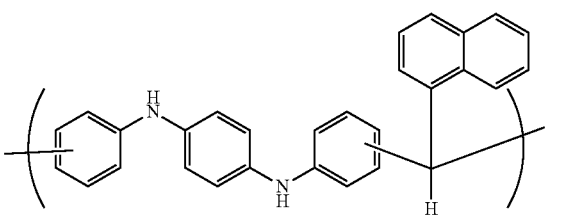

Formula (2-3)

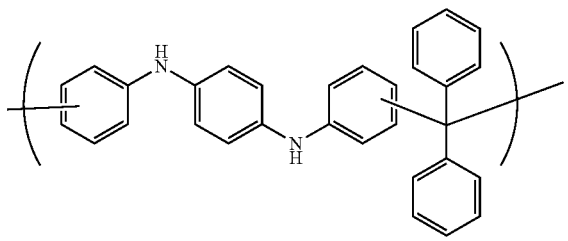

Formula (2-4)

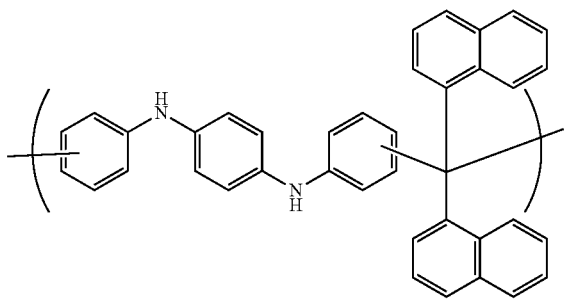

Formula (2-5)

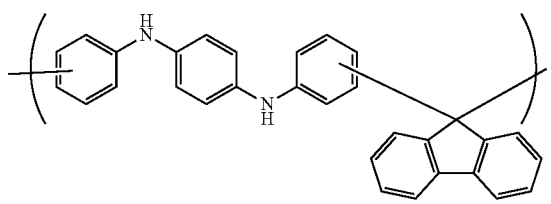

Formula (2-6)

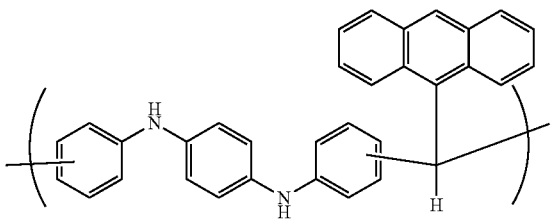

Formula (2-7)

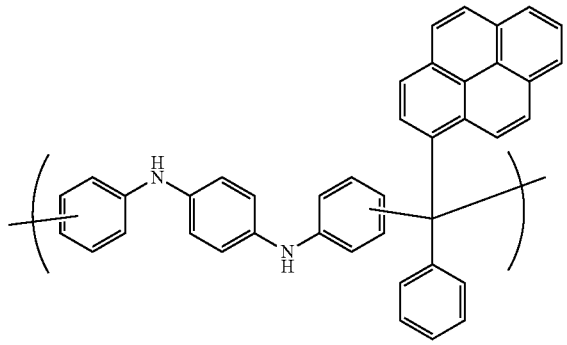

Formula (2-8)
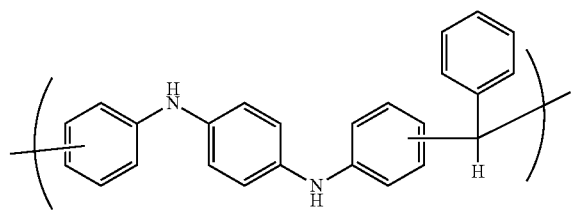
Formula (2-9)
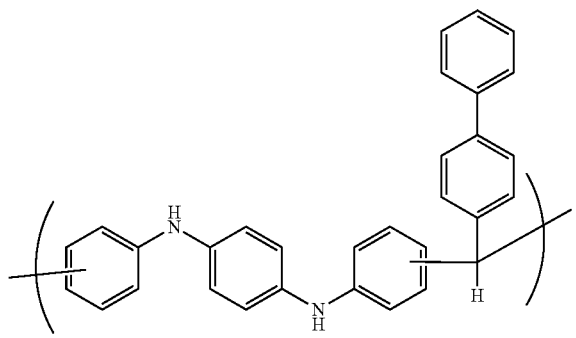
Formula (2-10)
Formula (2-11)
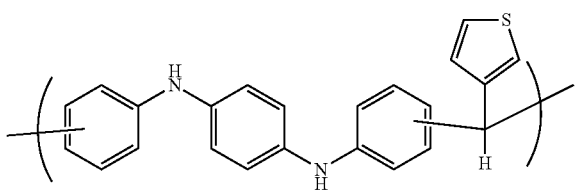
Formula (2-12)
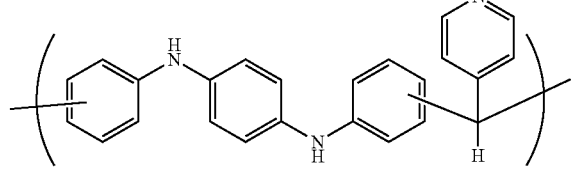
Formula (2-13)
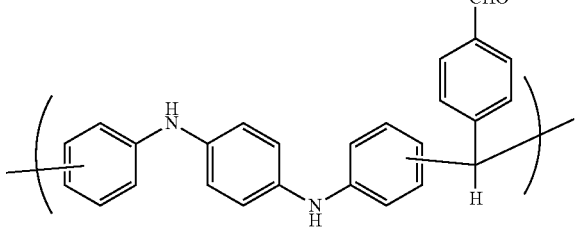
Formula (2-14)
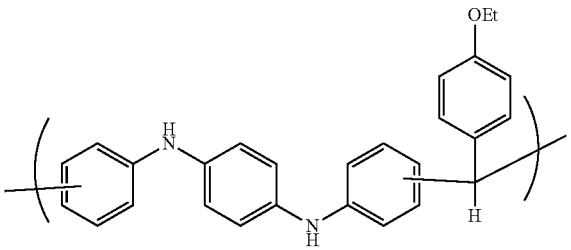
Formula (2-15)
Formula (2-16)
Formula (2-17)
Formula (2-18)
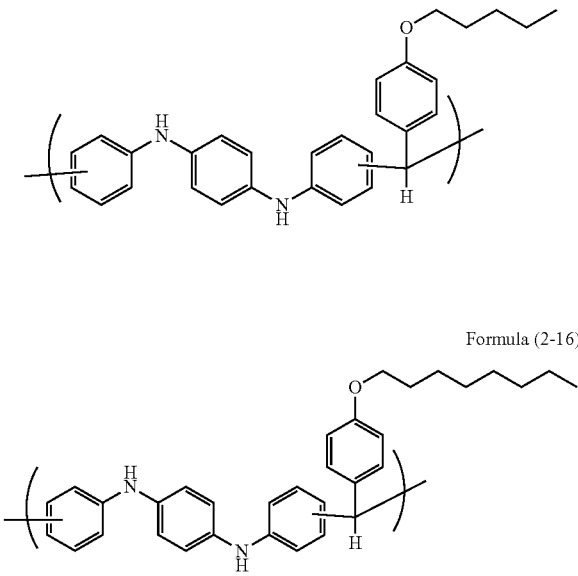

-continued

Formula (2-19)
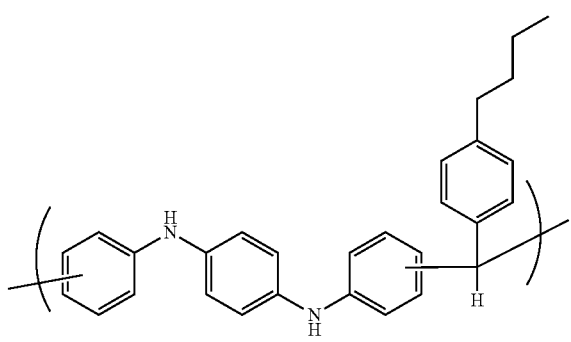

Formula (2-20)
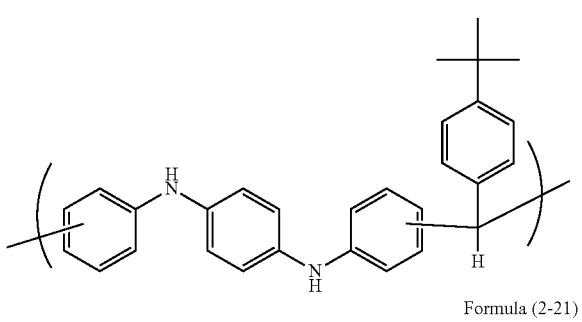

Formula (2-21)
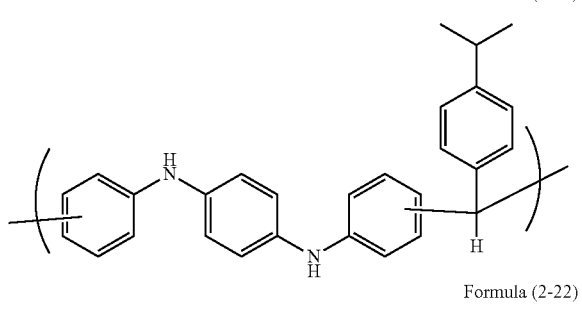

Formula (2-22)
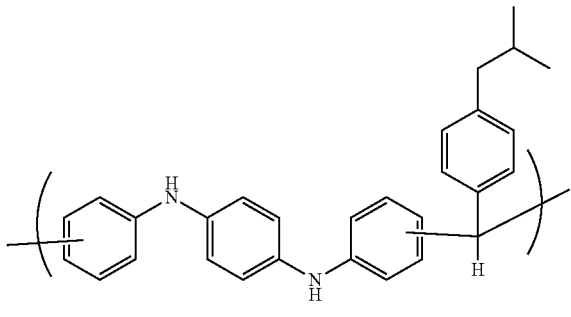

The resist underlayer film forming composition of the present invention may contain a crosslinker component. Examples of the crosslinker include a melamine-based crosslinker, a substituted urea-based crosslinker, or polymers thereof. The crosslinker is preferably a crosslinker having at least two crosslinking forming substituents. Examples thereof include compounds including methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of the compounds may also be used.

As the crosslinker, a crosslinker having high heat resistance may be used. As the crosslinker having high heat resistance, a compound containing a crosslinking forming substituent having an aromatic ring (e.g., a benzene ring or a naphthalene ring) in the molecule may be preferably used.

Examples of this compound include a compound having a partial structure of Formula (3) described below, and a polymer or oligomer having a repeating unit of Formula (4) described below.

Formula (3)
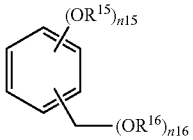

Formula (4)
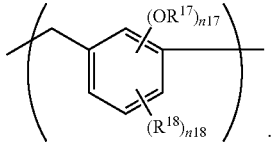

In Formula (3), $R^{15}$ and $R^{16}$ are each a hydrogen atom, a $C_{1-10}$ alkyl group, or a $C_{6-20}$ aryl group, n15 is an integer of 1 to 4, n16 is an integer of 1 to (5-n15), and n15+n16 is an integer of 2 to 5. In Formula (4), $R^{17}$ is a hydrogen atom or a $C_{1-10}$ alkyl group, $R^{18}$ is a $C_{1-10}$ alkyl group, n17 is an integer of 1 to 4, n18 is an integer of 0 to (4-n17), and n17+n18 is an integer of 1 to 4. The oligomer and polymer in which the number of repeating unit structures falls within a range of 2 to 100 or 2 to 50 may be used. Examples of the alkyl group and aryl group include those exemplified above.

Examples of the compound of Formula (3) and the polymer and oligomer of Formula (4) include as follows.

Formula (3-1)
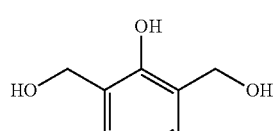

Formula (3-2)
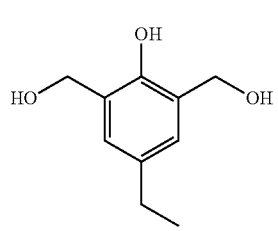

Formula (3-3)
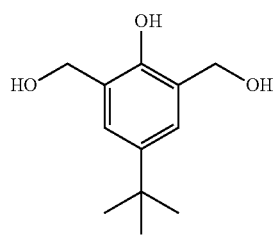

Formula (3-4)
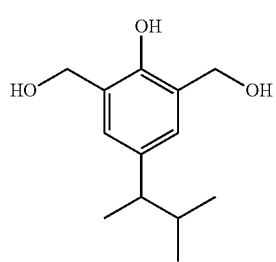
Formula (3-5)
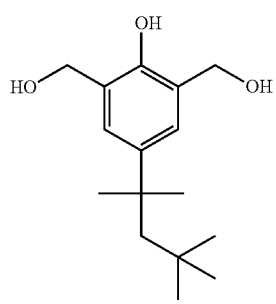
Formula (3-6)
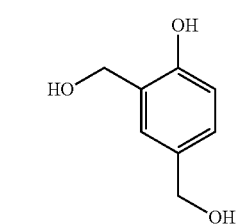
Formula (3-7)
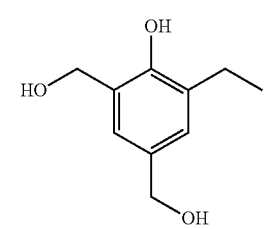
Formula (3-8)
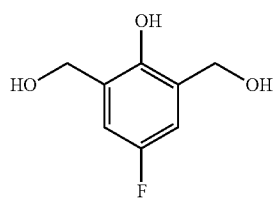
Formula (3-9)
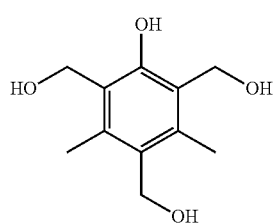
Formula (3-10)
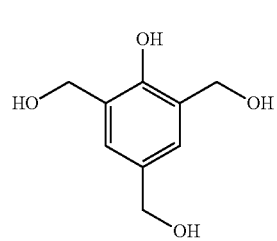
Formula (3-11)
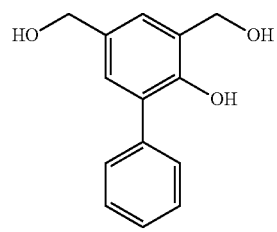
Formula (3-12)
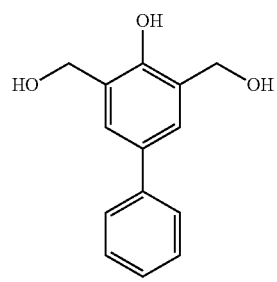
Formula (3-13)
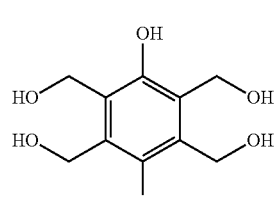
Formula (3-14)
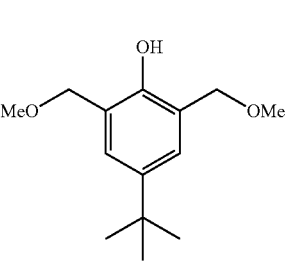
Formula (3-15)
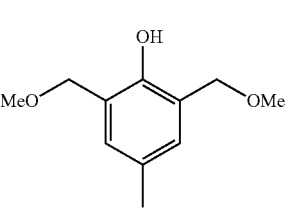
Formula (3-16)
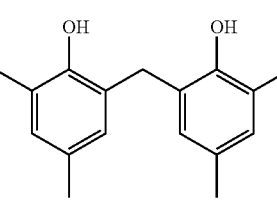

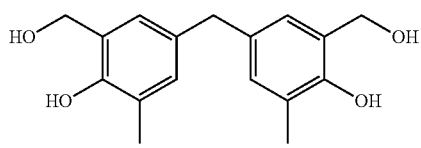
Formula (3-17)

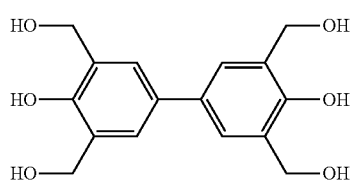
Formula (3-18)

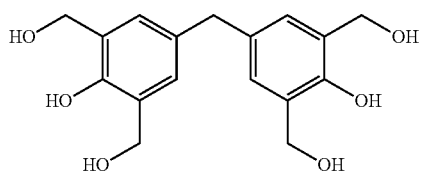
Formula (3-19)

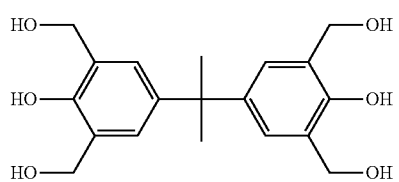
Formula (3-20)

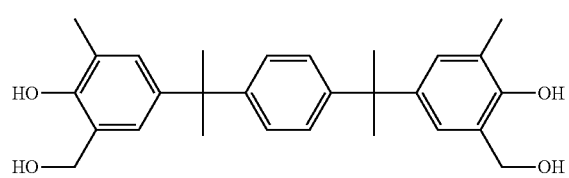
Formula (3-21)

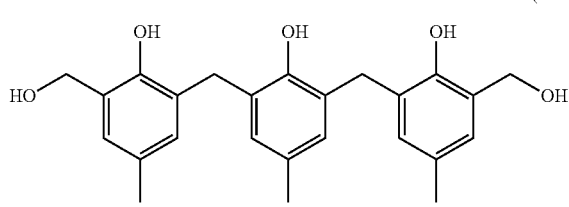
Formula (3-22)

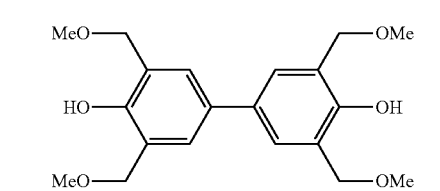
Formula (3-23)

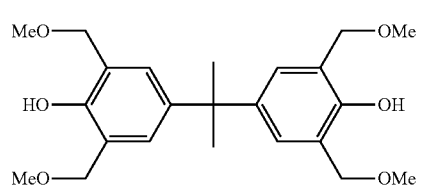
Formula (3-24)

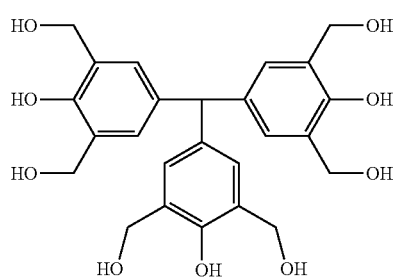
Formula (3-25)

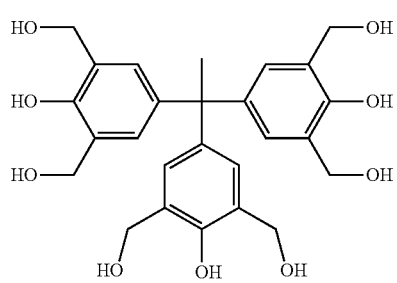
Formula (3-26)

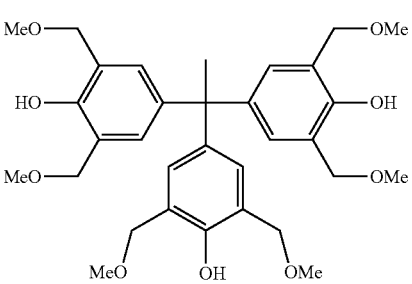
Formula (3-27)

The compounds described above are available as products from Asahi Organic Chemicals Industry Co., Ltd., and Honshu Chemical Industry Co., Ltd. Among the crosslinkers, for example, the compound of Formula (3-24) is available as trade name TM-BIP-A from Asahi Organic Chemicals Industry Co., Ltd.

The amount of the crosslinker to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content of the resist underlayer film forming composition for lithography of the present invention. The crosslinker may cause a crosslinking reaction due to self-condensation. However, when the polymer of the present invention has a crosslinkable substituent, the crosslinker may cause a crosslinking reaction with the crosslinkable substituent.

In the present invention, as a catalyst for promoting the aforementioned crosslinking reaction, an acidic compound such as p-toluenesulfonic acid, trifluoromethanesulfonic acid, pyridinium p-toluenesulfonate, salicylic acid, 5-sulfosalicylic acid, 4-phenolsulfonic acid, pyridinium 4-phenolsulfonate, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and other organic sulfonic acid alkyl ester may be mixed. The amount of the catalyst to be mixed is 0.0001 to 20% by mass, preferably 0.0005 to 10% by mass, and further preferably 0.01 to 3% by mass, relative to the total solid content of the resist underlayer film forming composition for lithography of the present invention.

In order to adjust the acidity of the resist underlayer film forming composition for lithography of the present invention so as to be identical to the acidity of a photoresist applied as an upper layer in a lithography process, a photoacid generator may be added. Preferable examples of the photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content of the resist underlayer film forming composition for lithography of the present invention.

In addition, the resist underlayer film forming composition for lithography of the present invention may contain a light absorber, a rheology modifier, an adhesive adjuvant, a surfactant, or the like, if necessary.

As the light absorber, a commercially available light absorber described in "Kogyoyoshikiso no gijutsu to shijo" (CMC Publishing Co., Ltd.) or "Senryo binran" (edited by The Society of Synthetic Organic Chemistry, Japan.), for example, C.I.Disperse Yellow 1, 3, 4, 5, 7, 8, 13, 23, 31, 49, 50, 51, 54, 60, 64, 66, 68, 79, 82, 88, 90, 93, 102, 114, and 124; C.I.Disperse Orange 1, 5, 13, 25, 29, 30, 31, 44, 57, 72, and 73; C.I.Disperse Red 1, 5, 7, 13, 17, 19, 43, 50, 54, 58, 65, 72, 73, 88, 117, 137, 143, 199, and 210; C.I.Disperse Violet 43; C.I.Disperse Blue 96; C.I.Fluorescent Brightening Agent 112, 135, and 163; C.I.Solvent Orange 2 and 45; C.I.Solvent Red 1, 3, 8, 23, 24, 25, 27, and 49; or C.I.Pigment Green 10; C.I.Pigment Brown 2 may be suitably used. The aforementioned light absorber is usually mixed in an amount of 10% by mass or less, and preferably 5% by mass or less, relative to the total solid content of the resist underlayer film forming composition for lithography of the present invention.

The rheology modifier is added to mainly improve the flowability of the resist underlayer film forming composition, and in particular, to improve the film thickness uniformity of a resist underlayer film and enhance the filling properties of the inside of holes with the resist underlayer film forming composition in a baking step. Specific examples thereof include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. The rheology modifier is usually mixed in an amount of less than 30% by mass relative to the total solid content of the resist underlayer film forming composition for lithography of the present invention.

The adhesive adjuvant is added to mainly improve the adhesion of the resist underlayer film forming composition to a substrate or a resist, and in particular, to prevent peeling of the resist in development. Specific examples thereof include chlorosilanes such as trimethylchlorosilane, dimethylvinylchlorosilane, methyldiphenylchlorosilane, and chloromethyldimethylchlomsilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; urea compounds such as 1,1-dimethylurea and 1,3-dimethylurea, and thiourea compounds. The adhesive adjuvant is usually mixed in an amount of less than 5% by mass, and preferably less than 2% by mass, relative to the total solid content of the resist underlayer film forming composition for lithography of the present invention.

In order to further improve the coating properties against unevenness of a surface without generating pinholes, striation, and the like, the resist underlayer film forming composition for lithography of the present invention may contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including Eftop EF301, EF303, and EF352 (trade name, available from Tohkem Products Corporation), MEGAFACE F171, F173, R-30, and R-30N (trade name, available from Dainippon Ink and Chemicals, Incorporated),DIC Corporation), Fluorad FC430 and FC431 (trade name, available from Sumitomo 3M, Ltd.), and AsahiGuard AG710 and Surflon S-382, SC101, SC102, SC103, SC104, SC105, and SC106 (trade name, available from Asahi Glass Co., Ltd.); and organosiloxane polymer KP341 (available from Shin-Etsu Chemical Co., Ltd.).

The amount of the surfactant to be mixed is usually 2.0% by mass or less, and preferably 1.0% by mass or less, relative to the total solid content of the resist underlayer film forming composition for lithography of the present invention. The surfactant may be added alone, or two or more types thereof may be added in combination.

As a solvent capable of dissolving the aforementioned polymer, the crosslinker component, the crosslinking catalyst, and the like, in the present invention, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like may be used. The organic solvent is used alone, or two or more types thereof are used in combination.

Further, a mixture of solvents having a high boiling point, such as propylene glycol monobutyl ether and propylene glycol monobutyl ether acetate, may be used. Among the solvents, propylene glycol monomethyl ether, propylene glycol monomethyl ether acetate, ethyl lactate, butyl lactate, and cyclohexanone are preferable in terms of improved leveling properties.

A resist used in the present invention is a photoresist or an electron beam resist.

As a photoresist applied to an upper part of a resist underlayer film for lithography in the present invention, any of a negative photoresist and a positive photoresist may be used. Examples thereof include a positive photoresist including a novolac resin and 1,2-naphthoquinone diazidesulfonic acid ester; a chemically amplified photoresist including a binder having a group that is decomposed by an acid to increase the alkali dissolution speed, and a photoacid generator; a chemically amplified photoresist including an alkali soluble binder, a low molecular compound that is decomposed by an acid to increase the alkali dissolution speed of the photoresist, and a photoacid generator; a chemically amplified photoresist including a binder having a group that is decomposed by an acid to increase the alkali dissolution speed, a low molecular compound that is decomposed by an acid to increase the alkali dissolution speed of the photoresist, and a photoacid generator; and a photoresist having a Si atom in the skeleton. Examples thereof include trade name APEX-E available from Rohm and Haas.

Examples of an electron beam resist applied to an upper part of a resist underlayer film for lithography in the present invention include a composition including a resin having a Si—Si bond in the main chain and an aromatic ring at the terminal and an acid generator that is irradiated with an electron beam to generate an acid; or a composition including poly(p-hydroxystyrene) of which a hydroxy group is substituted with an organic group containing N-carboxyamine and an acid generator that is irradiated with electron beam to generate an acid. In the latter electron beam resist composition, an acid generated by irradiation of the acid generator with an electron beam is reacted with a N-carboxyaminoxy group of a polymer side chain to decompose the polymer side chain into a hydroxy group. Thus, the electron beam resist composition exhibits alkali solubility. The electron beam resist composition is dissolved in an alkaline developer to form a resist pattern. Examples of the acid generator that is irradiated with an electron beam to generate an acid include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as a triphenyl sulfonium salt and a diphenyliodonium salt; and sulfonic acid esters such as nitrobenzyl tosylate and dinitrobenzyl tosylate.

As a developer for a resist having a resist underlayer film formed from the resist underlayer film forming composition for lithography of the present invention, an aqueous solution of an alkali such as an inorganic alkali such as sodium hydroxide, potassium hydroxide, sodium carbonate, sodium silicate, sodium methasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide, tetraethylammonium hydroxide, or choline, or a cyclic amine such as pyrrole or piperidine may be used. A solution in which proper amounts of an alcohol such as isopropyl alcohol and a surfactant such as a nonionic surfactant are added to the aqueous solution of the alkali may also be used. Among the developers, a quaternary ammonium salt is preferable, and tetramethylammonium hydroxide and choline are further preferable.

Next, a method for forming a resist pattern of the present invention will be described. The resist underlayer film forming composition is applied to a substrate (e.g., a transparent substrate such as a silicon/silicon dioxide coating, a glass substrate, and an ITO substrate) used in production of a precision integrated circuit element by an appropriate coating means such as a spinner and a coater, baked, and cured to form a coating underlayer film. The thickness of the resist underlayer film is preferably 0.01 to 3.0 µm. A baking condition after applying includes 80 to 400° C. and 0.5 to 120 minutes. After then, a resist is applied directly to the resist underlayer film, or if necessary, a resist is applied after one or more layers of coating material are formed on the coating underlayer film. The resist is irradiated with light or an electron beam through a predetermined mask, developed, rinsed, and dried. Thus, a favorable resist pattern can be obtained. Post exposure bake (PEB) may also be carried out after irradiation with light or an electron beam, if necessary. The resist underlayer film at a portion where the resist is developed and removed in the aforementioned step can be removed by dry etching, to form a desired pattern on the substrate.

Exposure light for the aforementioned photoresist is actinic light such as near ultraviolet light, far ultraviolet light, or extreme ultraviolet light (e.g., EUV, wavelength: 13.5 nm). For example, light having a wavelength of 248 nm (KrF laser beam), 193 run (ArF laser beam), or 157 nm ($F_2$ laser beam) is used. In irradiation with light, any method may be used without particular limitation as long as the method is capable of generating an acid from the photoacid generator. The exposure dose is 1 to 2,000 mJ/cm$^2$, 10 to 1,500 mJ/cm$^2$, or 50 to 1,000 mJ/cm$^2$.

In irradiation of electron beam resist with an electron beam, for example, an electron beam irradiation apparatus may be used.

In the present invention, a semiconductor device can be produced through steps of forming a resist underlayer film on a semiconductor substrate from the resist underlayer film forming composition of the present invention, forming a resist film on the resist underlayer film, irradiating the resist film with light or an electron beam and developing the resist film to form a resist pattern, etching the resist underlayer film through the formed resist pattern, and processing the semiconductor substrate through the patterned resist underlayer film.

When a resist pattern is made further finer, problems about resolution and collapse of the resist pattern after development are caused. Thus, a decrease in film thickness of a resist is desired. However, it is difficult to obtain a resist pattern film thickness sufficient for substrate processing. Thus, a process for imparting a function of a mask to not only a resist pattern but also a resist underlayer film to be formed between a resist and a semiconductor substrate to be processed during substrate processing is required. As a resist underlayer film for such a process, a resist underlayer film for lithography having a selection ratio of dry etching rate close to that of a resist, which is different from a conventional resist underlayer film having a high etching rate, a resist underlayer film for lithography having a lower selection ratio of dry etching rate than that of a resist, and a resist underlayer film for lithography having a lower selection ratio of dry etching rate than that of a semiconductor substrate are required. To such a resist underlayer film, an anti-reflective performance may be imparted, so that the resist underlayer film may have a function of a conventional anti-reflective coating.

On the other hand, during dry etching of the resist underlayer film, a process of making a resist pattern and a resist underlayer film finer than the pattern width during development of the resist has come into use, in order to obtain a finer resist pattern. As the resist underlayer film for such a process, a resist underlayer film having a selection ratio of dry etching rate close to that of a resist, which is different from a conventional anti-reflective coating having a high etching rate, is required. To such a resist underlayer film, an anti-reflective performance may be imparted, so that the resist underlayer film may have a function of a conventional anti-reflective coating.

In the present invention, a resist may be applied directly to the resist underlayer film of the present invention after formation of the resist underlayer film on a substrate, or if necessary, one or more layers of coating material may be formed on the resist underlayer film and a resist may be applied to the layers. Thus, even when the resist is thinly applied to prevent pattern collapse due to a decrease in pattern width of the resist, the substrate can be processed by appropriate selection of etching gas.

Specifically, a semiconductor device can be produced through steps of forming a resist underlayer film on a semiconductor substrate from the resist underlayer film forming composition of the present invention, forming a hard mask from a coating material containing a silicon component or the like or a hard mask (e.g., from silicon nitride oxide) by vapor deposition on the resist underlayer film, forming a resist film on the hard mask, irradiating the resist film with light or an electron beam and developing the resist film to form a resist pattern, etching the hard mask through the formed resist pattern by a halogen-based gas, etching the resist underlayer film through the patterned hard mask by an oxygen-based gas or a hydrogen-based gas, and processing the semiconductor substrate through the patterned resist underlayer film by a halogen-based gas.

In consideration of effect of anti-reflective coating, the resist underlayer film forming composition for lithography of the present invention does not diffuse a substance in the photoresist during heating and drying due to a light absorption moiety incorporated in the skeleton. The light absorption moiety has sufficiently high light absorption performance. Accordingly, the resist underlayer film forming composition has high anti-reflective effect.

The resist underlayer film forming composition for lithography of the present invention has high thermal stability, can prevent contamination of a top-layer film by a decomposed substance during baking, and can impart a temperature margin in a baking step.

Further, the resist underlayer film forming composition for lithography of the present invention can be used for a film having a function of preventing reflection of light depending on a process condition, and a function of preventing an interaction between a substrate and a photoresist or an adverse influence on the substrate of a substance produced during exposure of a material used for the photoresist or the photoresist to light.

EXAMPLES

Example 1

In a 100-mL four-neck flask, N,N'-diphenyl-1,4-phenylenediamine (15.34 g, 0.059 mol, available from Tokyo Chemical Industry Co., Ltd.), 4-methoxybenzaldehyde (8.00 g, 0.059 mol, available from Tokyo Chemical Industry Co., Ltd.), and propylene glycol monomethyl ether (24 g, available from Kanto Chemical Co., Inc.) were placed, and methanesulfonic acid (1.13 g, 0.012 mol, available from Tokyo Chemical Industry Co., Ltd.) was further placed. The mixture was stirred, heated to 135° C., and dissolved to initiate polymerization. After 2 hours, the resultant was allowed to cool to room temperature, and subjected to precipitation in methanol (800 g, available from Kanto Chemical Co., Inc.). The obtained precipitate was collected by filtration, and dried at 80° C. for 24 hours by a reduced-pressure dryer to obtain 22.3 g of target polymer ((corresponding to Formula (2-13)), hereinafter abbreviated as pDPPDA-MeOBA).

The weight average molecular weight Mw of pDPPDA-MeOBA was measured by GPC in terms of polystyrene to be 2,600, and the degree of distribution Mw/Mn was 1.60.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt of Formula (5) as a crosslinking catalyst, and 0.001 g of surfactant (trade name: MEGAFACE [trade name] R-30N available from DIC Corporation, fluorosurfactant) were dissolved in 3.51 g of cyclohexanone, 2.63 g of propylene glycol monomethyl ether, and 2.63 g of propylene glycol monomethyl ether acetate to prepare a resist underlayer film forming composition.

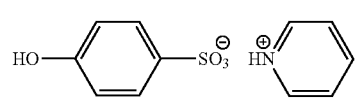

Formula (5)

Example 2

In a 100-mL four-neck flask, N,N'-diphenyl-1,4-phenylenediamine (13.90 g, 0.053 mol, available from Tokyo Chemical Industry Co., Ltd.), 4-ethoxybenzaldehyde (8.00 g, 0.053 mol, available from Tokyo Chemical Industry Co., Ltd.), and propylene glycol monomethyl ether (23 g, available from Kanto Chemical Co., Inc.) were placed, and methanesulfonic acid (1.02 g, 0.011 mol, available from Tokyo Chemical Industry Co., Ltd.) was further placed. The mixture was stirred, heated to 135° C., and dissolved to initiate polymerization. After 2 hours, the resultant was allowed to cool to room temperature, and subjected to precipitation in methanol (800 g, available from Kanto Chemical Co., Inc.). The obtained precipitate was collected by filtration, and dried at 80° C. for 24 hours by a reduced-pressure dryer to obtain 18.6 g of target polymer ((corresponding to Formula (2-14)), hereinafter abbreviated as pDPPDA-EtOBA).

The weight average molecular weight Mw of pDPPDA-EtOBA was measured by GPC in terms of polystyrene to be 2,700, and the degree of distribution Mw/Mn was 2.18.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 3

In a 100-mL four-neck flask, N,N'-diphenyl-1,4-phenylenediamine (109.59 g, 0.421 mol, available from Tokyo Chemical Industry Co., Ltd.), 4-pentyloxybenzaldehyde (80.00 g, 0.416 mol, available from Tokyo Chemical Industry Co., Ltd.), and propylene glycol monomethyl ether (196 g, available from Kanto Chemical Co., Inc.) were placed, and methanesulfonic acid (8.01 g, 0.083 mol, available from Tokyo Chemical Industry Co., Ltd.) was further placed. The mixture was stirred, heated to 135° C., and dissolved to initiate polymerization. After 18 hours, the resultant was allowed to cool to room temperature, diluted with THF (80 g, available from Kanto Chemical Co., Inc.), and subjected to precipitation in methanol (4,000 g, available from Kanto Chemical Co., Inc.). The obtained precipitate was collected by filtration, and dried at 80° C. for 24 hours by a reduced-pressure dryer to obtain 162.83 g of target polymer ((corresponding to Formula (2-15)), hereinafter abbreviated as pDPPDA-PenOBA).

The weight average molecular weight Mw of pDPPDA-PenOBA was measured by GPC in terms of polystyrene to be 3,900, and the degree of distribution Mw/Mn was 2.07.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 4

In a 500-mL four-neck flask, N,N'-diphenyl-1,4-phenylenediamine (8.87 g, 0.034 mol, available from Tokyo Chemical Industry Co., Ltd.), 4-n-octyloxybenzaldehyde (8.00 g, 0.034 mol, available from Tokyo Chemical Industry Co., Ltd.), and propylene glycol monomethyl ether (18 g, available from Kanto Chemical Co., Inc.) were placed, and methanesulfonic acid (0.65 g, 0.068 mol, available from Tokyo Chemical Industry Co., Ltd.) was further placed. The mixture was stirred, heated to 135° C., and dissolved to initiate polymerization. After 14 hours, the resultant was allowed to cool to room temperature, diluted with THF (3 g, available from Kanto Chemical Co., Inc.), and subjected to precipitation in methanol (400 g, available from Kanto Chemical Co., Inc.). The obtained precipitate was collected by filtration, and dried at 80° C. for 24 hours by a reduced-pressure dryer to obtain 13.77 g of target polymer ((corresponding to Formula (2-16)), hereinafter abbreviated as pDPPDA-OctOBA).

The weight average molecular weight Mw of pDPPDA-OctOBA was measured by GPC in terms of polystyrene to be 3,400, and the degree of distribution Mw/Mn was 2.87.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 5

In a 100-mL four-neck flask, N,N'-diphenyl-1,4-phenylenediamine (6.67 g, 0.025 mol, available from Tokyo Chemical Industry Co., Ltd.), 3,4,5-trimethoxybenzaldehyde (5.06 g, 0.026 mol, available from Tokyo Chemical Industry Co., Ltd.), and propylene glycol monomethyl ether (12 g, available from Kanto Chemical Co., Inc.) were placed, and methanesulfonic acid (0.50 g, 0.051 mol, available from Tokyo Chemical Industry Co., Ltd.) was further placed. The mixture was stirred, heated to 135° C., and dissolved to initiate polymerization. After 18 hours, the resultant was allowed to cool to room temperature, diluted with THF (6 g, available from Kanto Chemical Co., Inc.), and subjected to precipitation in a mixed solvent of methanol (400 g, available from Kanto Chemical Co., Inc.) and 30% ammonia water (5 g, available from Kanto Chemical Co., Inc.). The obtained precipitate was collected by filtration, and dried at 80° C. for 24 hours by a reduced-pressure dryer to obtain 10.12 g of target polymer ((corresponding to Formula (2-17)), hereinafter abbreviated as pDPPDA-triMeOBA).

The weight average molecular weight Mw of pDPPDA-triMeOBA was measured by GPC in terms of polystyrene to be 3,400, and the degree of distribution Mw/Mn was 2.27.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of cyclohexanone, 2.63 g of propylene glycol monomethyl ether, and 3.51 g of propylene glycol monomethyl ether acetate to prepare a resist underlayer film forming composition.

Example 6

In a 100-mL four-neck flask, N,N'-diphenyl-1,4-phenylenediamine (15.52 g, 0.060 mol, available from Tokyo Chemical Industry Co., Ltd.), 4-ethylbenzaldehyde (8.01 g, 0.060 mol, available from Tokyo Chemical Industry Co., Ltd.), and propylene glycol monomethyl ether (37 g, available from Kanto Chemical Co., Inc.) were placed, and methanesulfonic acid (1.15 g, 0.012 mol, available from Tokyo Chemical Industry Co., Ltd.) was further placed. The mixture was stirred, heated to 135° C., and dissolved to initiate polymerization. After 22 hours, the resultant was allowed to cool to room temperature, and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 21.32 g of target polymer ((corresponding to Formula (2-18)), hereinafter abbreviated as pDPPDA-EtBA).

The weight average molecular weight Mw of pDPPDA-EtBA was measured by GPC in terms of polystyrene to be 4,500, and the degree of distribution Mw/Mn was 2.99.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 7

In a 100-mL four-neck flask, N,N'-diphenyl-1,4-phenylenediamine (12.83 g, 0.049 mol, available from Tokyo Chemical Industry Co., Ltd.), 4-n-butylbenzaldehyde (8.01 g, 0.049 mol, available from Tokyo Chemical Industry Co., Ltd.), and propylene glycol monomethyl ether (33 g, available from Kanto Chemical Co., Inc.) were placed, and methanesulfonic acid (0.96 g, 0.010 mol, available from Tokyo Chemical Industry Co., Ltd.) was further placed. The mixture was stirred, heated to 135° C., and dissolved to initiate polymerization. After 22 hours, the resultant was allowed to cool to room temperature, and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 19.04 g of target polymer ((corresponding to Formula (2-19)), hereinafter abbreviated as pDPPDA-nBuBA).

The weight average molecular weight Mw of pDPPDA-nBuBA was measured by GPC in terms of polystyrene to be 4,700, and the degree of distribution Mw/Mn was 2.90.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 8

In a 100-mL four-neck flask, N,N'-diphenyl-1,4-phenylenediamine (14.43 g, 0.055 mol, available from Tokyo Chemical Industry Co., Ltd.), 4-tert-butylbenzaldehyde (9.01 g, 0.055 mol, available from Tokyo Chemical Industry Co., Ltd.), and propylene glycol monomethyl ether (37 g, available from Kanto Chemical Co., Inc.) were placed, and methanesulfonic acid (1.07 g, 0.011 mol, available from Tokyo Chemical Industry Co., Ltd.) was further placed. The mixture was stirred, heated to 135° C., and dissolved to initiate polymerization. After 22 hours, the resultant was allowed to cool to room temperature, diluted with THF (5 g, available from Kanto Chemical Co., Inc.), and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 22.14 g of target polymer ((corresponding to Formula (2-20)), hereinafter abbreviated as pDPPDA-tBuBA).

The weight average molecular weight Mw of pDPPDA-tBuBA was measured by GPC in terms of polystyrene to be 5,800, and the degree of distribution Mw/Mn was 3.11.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 9

In a 100-mL four-neck flask, N,N'-diphenyl-1,4-phenylenediamine (15.82 g, 0.061 mol, available from Tokyo Chemical Industry Co., Ltd.), 4-isopropylbenzaldehyde (9.01 g, 0.061 mol, available from Tokyo Chemical Industry Co., Ltd.), and propylene glycol monomethyl ether (39 g, available from Kanto Chemical Co., Inc.) were placed, and methanesulfonic acid (1.17 g, 0.012 mol, available from Tokyo Chemical Industry Co., Ltd.) was further placed. The mixture was stirred, heated to 135° C., and dissolved to initiate polymerization. After 22 hours, the resultant was allowed to cool to room temperature, diluted with THF (5 g, available from Kanto Chemical Co., Inc.), and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 23.87 g of target polymer ((corresponding to Formula (2-21)), hereinafter abbreviated as pDPPDA-iPrBA).

The weight average molecular weight Mw of pDPPDA-iPrBA was measured by GPC in terms of polystyrene to be 5,200, and the degree of distribution Mw/Mn was 3.23.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Example 10

In a 100-mL four-neck flask, N,N'-diphenyl-1,4-phenylenediamine (14.87 g, 0.057 mol, available from Tokyo Chemical Industry Co., Ltd.), 4-phenylbenzaldehyde (8.01 g, 0.044 mol, available from Tokyo Chemical Industry Co., Ltd.), and propylene glycol monomethyl ether (54 g, available from Kanto Chemical Co., Inc.) were placed, and methanesulfonic acid (0.42 g, 0.004 mol, available from Tokyo Chemical Industry Co., Ltd.) was further placed. The mixture was stirred, heated to 135° C., and dissolved to initiate polymerization. After 18 hours, the resultant was allowed to cool to room temperature, and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 18.00 g of target polymer ((corresponding to Formula (2-9)), hereinafter abbreviated as pDPPDA-PBA).

The weight average molecular weight Mw of pDPPDA-PBA was measured by GPC in terms of polystyrene to be 3,100, and the degree of distribution Mw/Mn was 2.33.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 3.51 g of cyclohexanone, 2.63 g of propylene glycol monomethyl ether, and 2.63 g of propylene glycol monomethyl ether acetate to prepare a resist underlayer film forming composition.

Example 11

In a 100-mL four-neck flask, N,N'-diphenyl-1,4-phenylenediamine (16.72 g, 0.064 mol, available from Tokyo Chemical Industry Co., Ltd.), 4-isobutylbenzaldehyde (8.00 g, 0.049 mol, available from Tokyo Chemical Industry Co., Ltd.), and propylene glycol monomethyl ether (38 g, available from Kanto Chemical Co., Inc.) were placed, and methanesulfonic acid (0.96 g, 0.010 mol, available from Tokyo Chemical Industry Co., Ltd.) was further placed. The mixture was stifled, heated to 135° C., and dissolved to initiate polymerization. After 18 hours, the resultant was allowed to cool to room temperature, and subjected to precipitation in a mixed solvent of methanol (800 g, available from Kanto Chemical Co., Inc.) and 30% ammonia water (50 g, available from Kanto Chemical Co., Inc.). The obtained precipitate was collected by filtration, and dried at 80° C. for 24 hours by a reduced-pressure dryer to obtain 18.97 g of target polymer ((corresponding to Formula (2-22)), hereinafter abbreviated as pDPPDA-iBuBA).

The weight average molecular weight Mw of pDPPDA-iBuBA was measured by GPC in terms of polystyrene to be 2,800, and the degree of distribution Mw/Mn was 1.99.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

Comparative Example 1

In a 100-mL four-neck flask, diphenylamine (15.94 g, 0.094 mol, available from Tokyo Chemical Industry Co., Ltd.), benzaldehyde (10.00 g, 0.094 mol, available from Tokyo Chemical Industry Co., Ltd.), and propylene glycol monomethyl ether (62 g, available from Kanto Chemical Co., Inc.) were placed, and methanesulfonic acid (0.45 g, 0.005 mol, available from Tokyo Chemical Industry Co., Ltd.) was further placed. The mixture was stirred, heated to 135° C., and dissolved to initiate polymerization. After 1 hour, the resultant was allowed to cool to room temperature, and subjected to precipitation in methanol (800 g, available from Kanto Chemical Co., Inc.). The obtained precipitate was collected by filtration, and dried at 80° C. for 24 hours by a reduced-pressure dryer to obtain 15.07 g of target polymer ((corresponding to Formula (6)), hereinafter abbreviated as pDPA-BA).

The weight average molecular weight Mw of pDPA-BA was measured by GPC in terms of polystyrene to be 4,100, and the degree of distribution Mw/Mn was 2.22.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

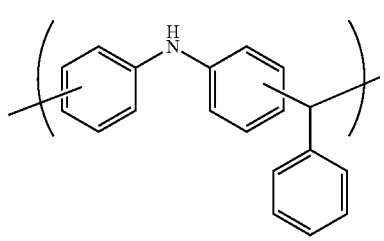

Formula (6)

Comparative Example 2

In a 100-mL four-neck flask, N-phenyl-1-naphthylamine (17.53 g, 0.080 mol, available from Tokyo Chemical Industry Co., Ltd.), benzaldehyde (8.49 g, 0.080 mol, available from Tokyo Chemical Industry Co., Ltd.), and propylene glycol monomethyl ether acetate (62 g, available from Kanto Chemical Co., Inc.) were placed, and methanesulfonic acid (0.77 g, 0.008 mol, available from Tokyo Chemical Industry Co., Ltd.) was further placed. The mixture was stirred, heated to 135° C., and dissolved to initiate polymerization. After 30 minutes, the resultant was allowed to cool to room temperature, diluted with THF (18 g, available from Kanto Chemical Co., Inc.), and subjected to precipitation in methanol (800 g, available from Kanto Chemical Co., Inc.). The obtained precipitate was collected by filtration, and dried at 80° C. for 24 hours by a reduced-pressure dryer to obtain 21.04 g of target polymer ((corresponding to Formula (7)), hereinafter abbreviated as pNP1NA-BA).

The weight average molecular weight Mw of pNP1NA-BA was measured by GPC in terms of polystyrene to be 3,700, and the degree of distribution Mw/Mn was 2.14.

Subsequently, 1.00 g of the obtained novolac resin, 0.20 g of 3,3',5,5'-tetramethoxymethyl-4,4'-bisphenol (trade name: TMOM-BP available from Honshu Chemical Industry Co., Ltd.) as a crosslinker, 0.030 g of p-phenolsulfonic acid pyridine salt as a crosslinking catalyst, and 0.001 g of surfactant (trade name: MEGAFACE [trade name] R-30N available from DIC Corporation, fluorosurfactant) were dissolved in 2.63 g of propylene glycol monomethyl ether and 6.14 g of propylene glycol monomethyl ether acetate to prepare a resist underlayer film forming composition.

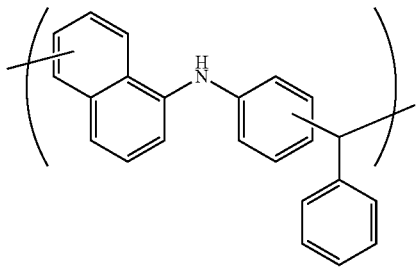

Formula (7)

[Heat Resistance Test of Film]

The solution of the resist underlayer film forming composition prepared in each of Examples 1 to 11 and Comparative Examples 1 and 2 was applied to a silicon wafer by a spin coater, and then baked on a hot plate at 200° C. for 90 seconds to form a resist underlayer film. The obtained film was heated at a rate of 10° C./minute, and subjected to thermogravimetric analysis in air. The temperature at which the mass was decreased by 5% was measured. The results are shown in Table 1.

TABLE 1

Temperature at which the mass of a film was decreased by 5%

| | Film baked at 200° C. for 90 seconds |
|---|---|
| Example 1 | 400° C. |
| Example 2 | 412° C. |
| Example 3 | 403° C. |
| Example 4 | 401° C. |
| Example 5 | 382° C. |
| Example 6 | 448° C. |
| Example 7 | 412° C. |
| Example 8 | 434° C. |
| Example 9 | 421° C. |
| Example 10 | 415° C. |
| Example 11 | 424° C. |
| Comparative Example 1 | 388° C. |
| Comparative Example 2 | 379° C. |

The results of Table 1 showed that the resist underlayer film formed from the resist underlayer film forming composition of the present invention had higher heat resistance than that of the films prepared in Comparative Examples 1 and 2.

[Test of Evaluating Optical Constant and Etching Rate]

The resist underlayer film forming composition prepared in each of Examples 1 to 11 and Comparative Examples 1 and 2 was applied to a silicon wafer, and heated on a hot plate at 400° C. for 90 seconds to form a film. The refractive index and attenuation coefficient of each of the films of the resist underlayer film forming compositions were measured at 193 nm.

In the measurement of refractive index and attenuation coefficient, an ellipsometer (VUV-VASE) manufactured by J. A. Woollam. Japan Corp., was used.

The resist underlayer film forming composition prepared in each of Examples 1 to 11 and Comparative Examples 1 and 2 was applied to a silicon wafer, and heated on a hot plate at 400° C. for 90 seconds to form a resist underlayer film. The dry etching rates of the resist underlayer films were each compared with that of a resist film obtained from a resist solution available from Sumitomo Chemical Co., Ltd., (trade name: SUMIRESIST PAR855). In measurement of dry etching rate, a dry etching apparatus (RIE-10NR) manufactured by Samco Inc., was used. The dry etching rate using a $CF_4$ gas was measured.

The refractive index (n value), attenuation coefficient (k value), and ratio of dry etching rate (selection ratio of dry etching rate) of the films of the resist underlayer film forming compositions are shown in Table 2.

Selection ratio of dry etching rate=(dry etching rate of each resist underlayer film)/(dry etching rate of resist film)

TABLE 2

| | Refractive index (n value) | Attenuation coefficient (k value) | Wavelength (nm) | Selection ratio of dry etching rate |
|---|---|---|---|---|
| Example 1 | 1.46 | 0.56 | 193 | 0.88 |
| Example 2 | 1.46 | 0.55 | 193 | 0.84 |
| Example 3 | 1.42 | 0.54 | 193 | 0.81 |
| Example 4 | 1.44 | 0.55 | 193 | 0.91 |
| Example 5 | 1.43 | 0.46 | 193 | 0.93 |
| Example 6 | 1.45 | 0.53 | 193 | 0.69 |
| Example 7 | 1.45 | 0.52 | 193 | 0.84 |
| Example 8 | 1.46 | 0.52 | 193 | 0.81 |
| Example 9 | 1.45 | 0.53 | 193 | 0.85 |
| Example 10 | 1.46 | 0.59 | 193 | 0.69 |
| Example 11 | 1.44 | 0.54 | 193 | 0.83 |
| Comparative Example 1 | 1.50 | 0.59 | 193 | 0.76 |
| Comparative Example 2 | 1.45 | 0.55 | 193 | 0.75 |

According to the results of Table 2, the resist underlayer film obtained from the resist underlayer film forming composition of the present invention has an appropriate antireflective effect. When a resist film is formed on an upper layer of the resist underlayer film obtained from the resist underlayer film forming composition of the present invention, exposed, and developed to form a resist pattern and a substrate is processed by dry etching through the resist pattern using an etching gas or the like, the substrate can be processed. This is because the dry etching rate against the resist film is higher.

[Test of Coating Stepped Substrate]

For evaluation of step-coating properties, the thicknesses of coating film at a dense pattern area (DENSE) with a trench width of 50 nm and a pitch of 100 nm and an open area (OPEN) having no pattern using a $SiO_2$ substrate with a film thickness of 200 nm were compared. The resist underlayer film forming composition of each of Examples 1 to 11 and Comparative Examples 1 and 2 was applied to the substrate, and baked at 400° C. for 90 seconds so that the thickness was 150 nm. The properties of coating a step of the substrate were observed by a scanning electron microscope (S-4800) manufactured by Hitachi High-Technologies Corporation, and the difference between the film thickness at the dense area (pattern part) and the film thickness at the open area (unpatterned part) (difference in level of coating between the dense area and the open area, referred to as Bias) was measured. Thus, the flattening properties were evaluated. The thickness and the difference in level of coating at each area are shown in Table 3. In the evaluation of flattening properties, as the value of Bias is smaller, the flattening properties are higher.

TABLE 3

|  | DENSE thickness (nm) | OPEN thickness (nm) | DENSE/OPEN difference in level of coating (nm) |
|---|---|---|---|
| Example 1 | 89 nm | 147 nm | 58 nm |
| Example 2 | 83 nm | 139 nm | 56 nm |
| Example 3 | 97 nm | 125 nm | 28 nm |
| Example 4 | 123 nm | 141 nm | 18 nm |
| Example 5 | 89 nm | 139 nm | 50 nm |
| Example 6 | 81 nm | 141 nm | 60 nm |
| Example 7 | 105 nm | 143 nm | 38 nm |
| Example 8 | 93 nm | 145 nm | 52 nm |
| Example 9 | 89 nm | 141 nm | 52 nm |
| Example 10 | 87 nm | 139 nm | 52 nm |
| Example 11 | 121 nm | 137 nm | 16 nm |
| Comparative Example 1 | 70 nm | 143 nm | 73 nm |
| Comparative Example 2 | 75 nm | 145 nm | 70 nm |

In comparison of the properties of coating the stepped substrate, the difference in level of coating between the pattern area and the open area in the results of Examples 1 to 11 is smaller than that in the results of Comparative Examples 1 and 2. This shows that the resist underlayer films obtained from the resist underlayer film forming compositions of Examples 1 to 11 have good flattening properties.

In a method for forming a resist underlayer film by applying the resist underlayer film forming composition of the present invention to a semiconductor substrate followed by baking, the difference in level of coating between a portion including a step and a portion including no step of the substrate can be 16 to 61 nm, 16 to 50 nm, or 16 to 30 nm.

Accordingly, the present invention can provide a material having properties achieving a good balance among heat resistance, flattening properties, and etching resistance of a resist underlayer film.

[Embedding Test in Stepped Substrate]

For evaluation of embeddability, the embeddability in a hole pattern area (DENSE) with a hole diameter of 80 nm and a pitch of 100 nm of a $SiO_2$ substrate with a thickness of 500 nm was evaluated. The resist underlayer film forming composition of each of Examples 1 to 11 and Comparative Examples 1 and 2 was applied to the substrate by a spin coater, and baked at 400° C. for 90 seconds so that the thickness was 200 nm. The cross section of the substrate (hole substrate) was observed by a scanning electron microscope (S-4800) manufactured by Hitachi High-Technologies Corporation to see the embeddability of the resist underlayer film forming composition in the substrate. When a void (cavity) is not generated in the inside of a hole and embedding is achieved, the embeddability is "good." When generation of a void is observed, the embeddability is "poor."

TABLE 4

| Embeddability in hole substrate | |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Comparative Example 1 | Poor |
| Comparative Example 2 | Poor |

The results in evaluation of embeddability showed that for the resist underlayer film forming compositions prepared in Examples 1 to 11, the inside of hole of the hole substrate was sufficiently filled with the resist underlayer film. As for the resist underlayer film forming compositions prepared in Comparative Examples 1 and 2, a void (cavity) was generated in the inside of a hole.

The present invention can provide a resist underlayer film material having excellent embeddability in a structure having a small width.

INDUSTRIAL APPLICABILITY

The resist underlayer film forming composition of the present invention exhibits high reflow properties in a baking step after applying the resist underlayer film forming composition to a substrate. The resist underlayer film forming composition can be flatly applied even to a stepped substrate. Thus, a flat film can be formed. Further, the film has an appropriate anti-reflective effect and a higher dry etching rate than that of a resist film, and thus the substrate can be processed. Accordingly, the resist underlayer film forming composition is useful.

The invention claimed is:

1. A resist underlayer film forming composition comprising a polymer having a unit structure of Formula (1):

Formula (1)

wherein
$R^1$ is a divalent organic group derived from a compound of Formula (2):

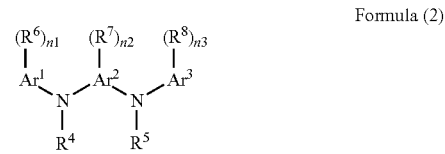

Formula (2)

wherein $Ar^1$, $Ar^2$, and $Ar^3$ are each a benzene ring or a naphthalene ring, $R^6$, $R^7$, and $R^8$ are each a substituent, and are selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group of $R^6$, $R^7$, and $R^8$ optionally contain an ether bond, a ketone bond, or an ester bond, $R^4$ and $R^5$ are each selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group of $R^4$ and $R^5$ optionally contain an ether bond, a ketone bond, or an ester bond, and n1, n2, and n3 are each an integer of 0 to the maximum number of substitutions possible for each of substituents $R^6$, $R^7$, and $R^8$ on the rings of $Ar^1$, $Ar^2$, and $Ar^3$, respectively, and wherein $R^3$ is a hydrogen atom, and $R^2$ is a phenyl group, wherein the phenyl group is optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group.

2. The resist underlayer film forming composition according to claim 1, further comprising a crosslinker.

3. The resist underlayer film forming composition according to claim 1, further comprising an acid and/or an acid generator.

4. A resist underlayer film comprising a cured film of the resist underlayer film forming composition according to claim 1.

5. A method for producing a semiconductor device comprising steps of:
   forming an underlayer film on a semiconductor substrate from the resist underlayer film forming composition according to claim 1;
   forming a resist film on the underlayer film;
   irradiating the resist film with light or an electron beam and developing the resist film to form a resist pattern;
   etching the underlayer film through the formed resist pattern; and
   processing the semiconductor substrate through the patterned underlayer film.

6. A method for producing a semiconductor device comprising steps of:
   forming an underlayer film on a semiconductor substrate from the resist underlayer film forming composition according to claim 1;
   forming a hard mask on the underlayer film;
   forming a resist film on the hard mask;
   irradiating the resist film with light or an electron beam and developing the resist film to form a resist pattern;
   etching the hard mask through the formed resist pattern;
   etching the underlayer film through the patterned hard mask; and
   processing the semiconductor substrate through the patterned underlayer film.

7. A resist underlayer film forming composition comprising a polymer, wherein the polymer is selected from the group consisting of polymers having the following structures:

Formula (2-1)

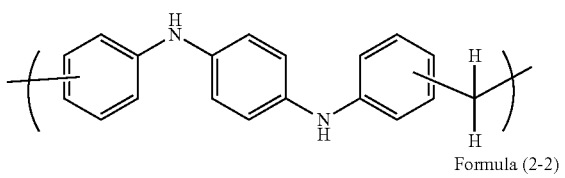

Formula (2-2)

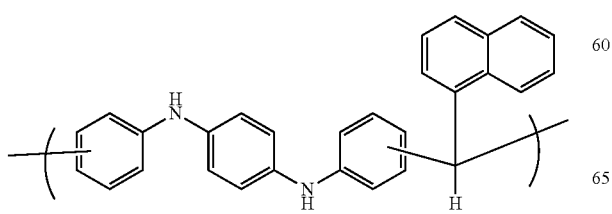

Formula (2-3)

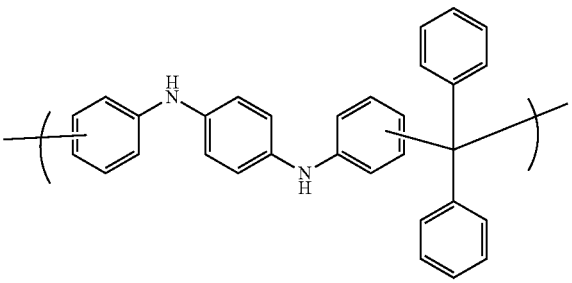

Formula (2-4)

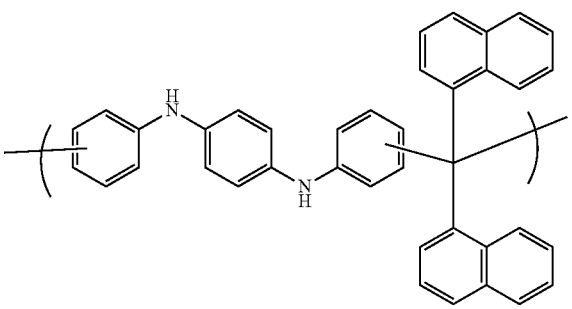

Formula (2-5)

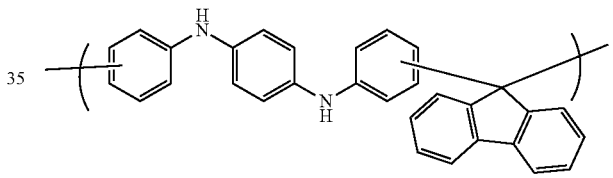

Formula (2-6)

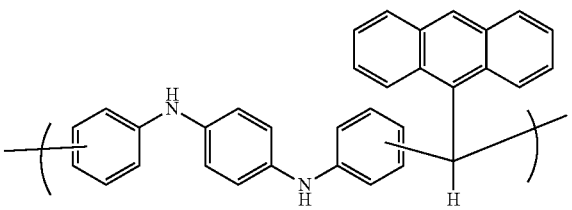

Formula (2-7)

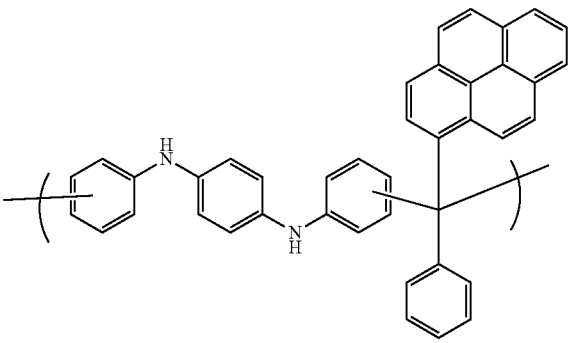

Formula (2-8)
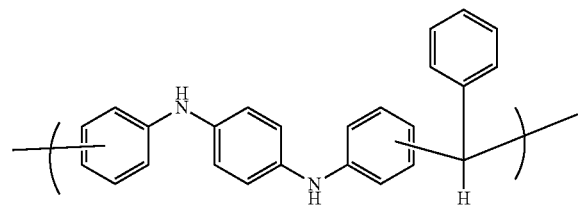
Formula (2-13)
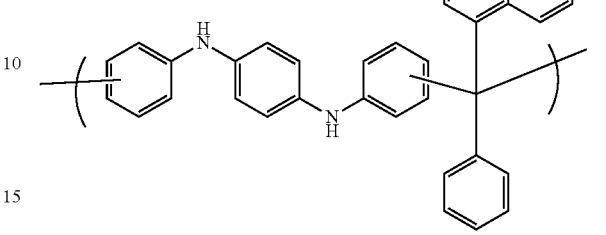
Formula (2-9)
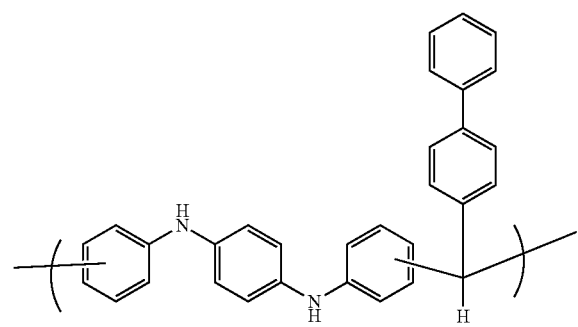
Formula (2-14)
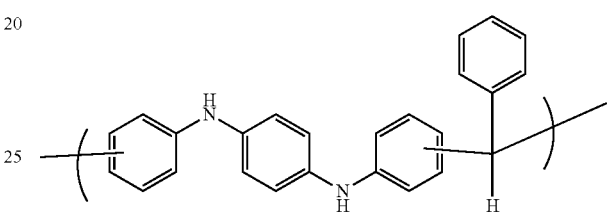
Formula (2-10)
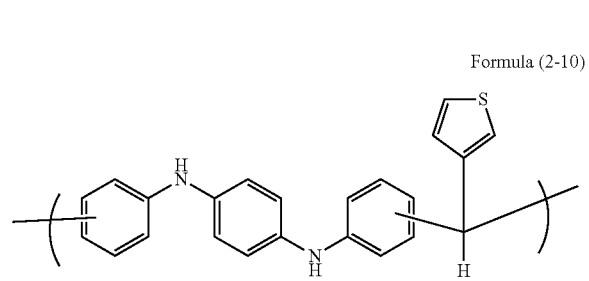
Formula (2-15)
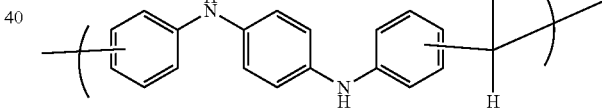
Formula (2-11)
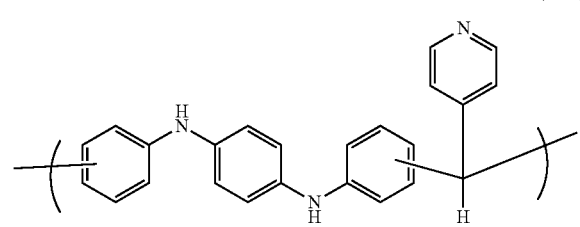
Formula (2-16)
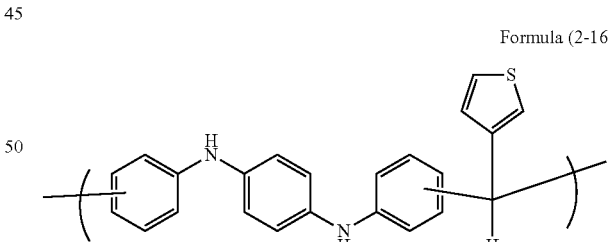
Formula (2-12)
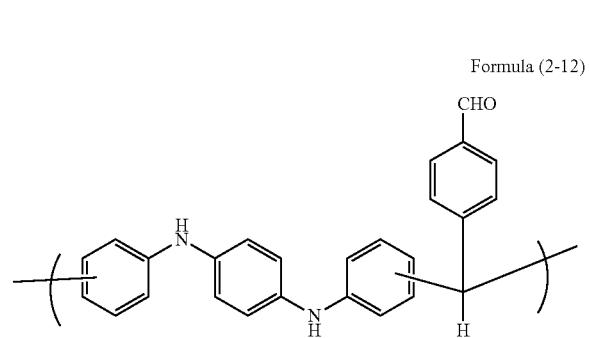
Formula (2-17)
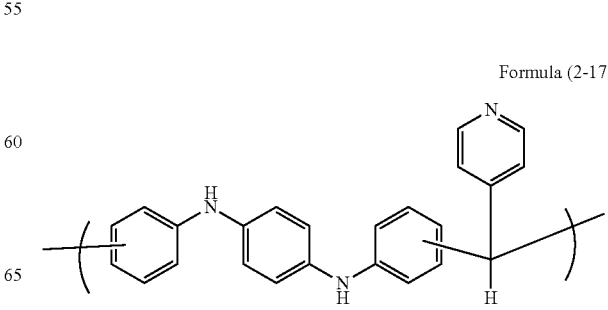

-continued

Formula (2-18)
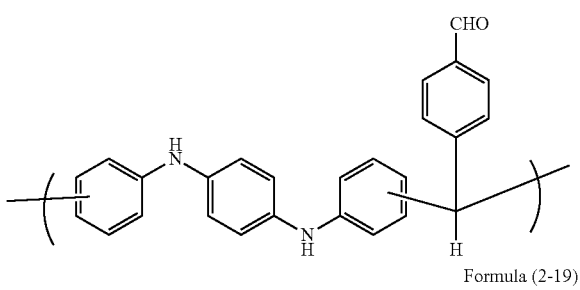

Formula (2-19)
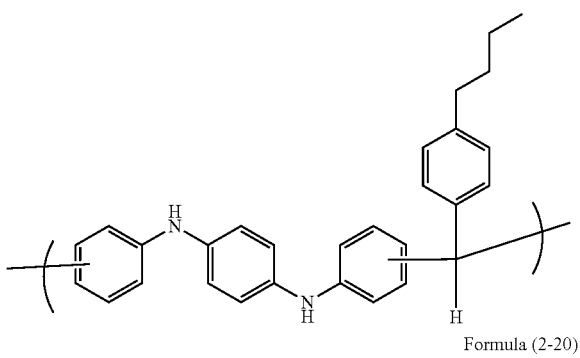

Formula (2-20)
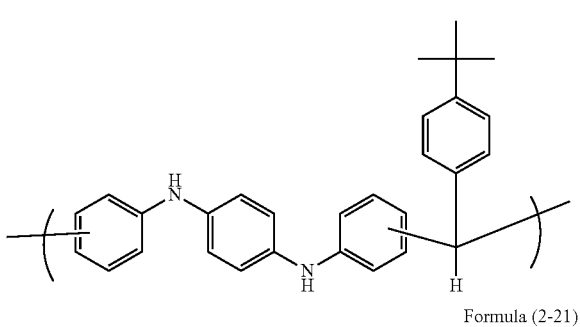

Formula (2-21)
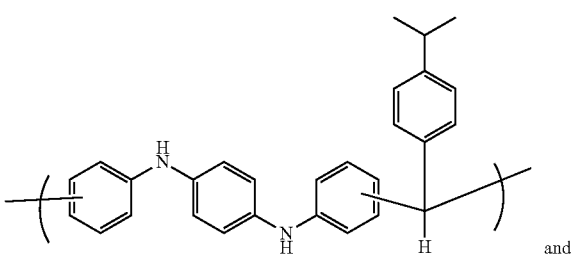
and

Formula (2-22)
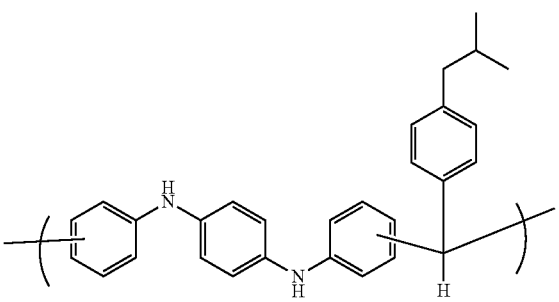

8. The resist underlayer film forming composition according to claim 7, further comprising a crosslinker.

9. The resist underlayer film forming composition according to claim 7, further comprising an acid and/or an acid generator.

10. A resist underlayer film comprising a cured film of the resist underlayer film forming composition according to claim 7.

11. A method for producing a semiconductor device comprising steps of:
  forming an underlayer film on a semiconductor substrate from the resist underlayer film forming composition according to claim 7;
  forming a resist film on the underlayer film;
  irradiating the resist film with light or an electron beam and developing the resist film to form a resist pattern;
  etching the underlayer film through the formed resist pattern; and
  processing the semiconductor substrate through the patterned underlayer film.

12. A method for producing a semiconductor device comprising steps of:
  forming an underlayer film on a semiconductor substrate from the resist underlayer film forming composition according to claim 7;
  forming a hard mask on the underlayer film;
  forming a resist film on the hard mask;
  irradiating the resist film with light or an electron beam and developing the resist film to form a resist pattern;
  etching the hard mask through the formed resist pattern;
  etching the underlayer film through the patterned hard mask; and
  processing the semiconductor substrate through the patterned underlayer film.

* * * * *